(12) United States Patent
Oka et al.

(10) Patent No.: US 8,908,978 B2
(45) Date of Patent: Dec. 9, 2014

(54) SIGNATURE REPRESENTATION OF DATA HAVING HIGH DIMENSIONALITY

(71) Applicant: BlackBerry Limited, Waterloo (CA)

(72) Inventors: Anand Ravindra Oka, Waterloo (CA); Christopher Harris Snow, Kitchener (CA); Sean Bartholomew Simmons, Waterloo (CA)

(73) Assignee: BlackBerry Limited, Waterloo (CA)

( * ) Notice: Subject to any disclaimer, the term of this patent is extended or adjusted under 35 U.S.C. 154(b) by 0 days.

(21) Appl. No.: 14/298,285

(22) Filed: Jun. 6, 2014

(65) Prior Publication Data

US 2014/0286582 A1    Sep. 25, 2014

Related U.S. Application Data

(63) Continuation of application No. 13/416,538, filed on Mar. 9, 2012, now Pat. No. 8,750,617.

(51) Int. Cl.
| | |
|---|---|
| *G06K 9/36* | (2006.01) |
| *G06T 9/00* | (2006.01) |
| *H03M 7/30* | (2006.01) |
| *H04L 27/00* | (2006.01) |

(52) U.S. Cl.
CPC ............... *G06T 9/00* (2013.01); *H03M 7/3062* (2013.01); *H04L 27/0006* (2013.01)
USPC ........................................................ 382/232

(58) Field of Classification Search
USPC .................. 382/181–231, 232–253
See application file for complete search history.

(56) References Cited

U.S. PATENT DOCUMENTS

| | | | | |
|---|---|---|---|---|
| 7,565,491 | B2 * | 7/2009 | Lemen et al. | 711/128 |
| 7,908,438 | B2 * | 3/2011 | Lemen et al. | 711/128 |
| 8,106,828 | B1 | 1/2012 | Do et al. | |
| 2003/0065520 | A1 * | 4/2003 | Jutzi et al. | 705/1 |
| 2004/0205063 | A1 * | 10/2004 | Coady | 707/3 |

(Continued)

FOREIGN PATENT DOCUMENTS

| | | |
|---|---|---|
| WO | 0034799 A1 | 5/2000 |
| WO | 2005062066 A2 | 7/2005 |
| WO | 2006117587 A1 | 11/2006 |

OTHER PUBLICATIONS

European Patent Office, Extended European Search Report dated Jul. 31, 2012, filed in European Patent Application No. 12158951.9.

(Continued)

*Primary Examiner* — Alex Liew
(74) *Attorney, Agent, or Firm* — Norton Rose Fulbright Canada LLP

(57) ABSTRACT

A system and method for generating an m-dimensional signature vector in a computing device is provided. The signature vector may be generated from a plurality of key-value pairs, each comprising a unique identifier and an associated non-zero value. Each element of the m-dimensional signature vector is calculated based on a summation of a plurality of terms. Each of the terms is calculated from a respective key-value pair by generating a seed based on the key of the respective key-value pair and an element identifier associated with the vector element being calculated; generating a pseudo-random number from the generated seed; and multiplying the pseudo-random number by the value of the respective key-value pair, wherein $m \ll n$.

27 Claims, 9 Drawing Sheets

(56) References Cited

U.S. PATENT DOCUMENTS

| | | |
|---|---|---|
| 2004/0205509 A1* | 10/2004 | Lou .................... 715/501.1 |
| 2005/0176442 A1 | 8/2005 | Ju et al. |
| 2005/0246334 A1 | 11/2005 | Tao et al. |
| 2006/0019679 A1 | 1/2006 | Rappaport et al. |
| 2006/0183450 A1 | 8/2006 | Cameron |
| 2007/0005589 A1 | 1/2007 | Gollapudi |
| 2007/0139269 A1 | 6/2007 | Chen et al. |
| 2008/0004036 A1 | 1/2008 | Bhuta et al. |
| 2008/0076430 A1 | 3/2008 | Olson |
| 2008/0176583 A1 | 7/2008 | Brachet et al. |
| 2008/0186234 A1 | 8/2008 | Alles et al. |
| 2008/0205774 A1* | 8/2008 | Brinker et al. ............ 382/225 |
| 2009/0028266 A1* | 1/2009 | Schneider ................ 375/286 |
| 2009/0109095 A1 | 4/2009 | Hido et al. |
| 2009/0210418 A1 | 8/2009 | Arasu et al. |
| 2010/0094840 A1 | 4/2010 | Donnelly et al. |
| 2010/0171993 A1 | 7/2010 | Longobardi et al. |
| 2011/0269479 A1 | 11/2011 | Ledlie |
| 2013/0236112 A1* | 9/2013 | Oka et al. ................ 382/232 |

OTHER PUBLICATIONS

Haiying Shen et al, Locality Sensitive Hashing Based Searching Scheme for a Massive Database, SouthEastcon, 2008, IEEE, Piscataway N.J., USA, Apr. 3, 2008, pp. 123-128. XP031245568.
United States Patent and Trademark Office, Office Action Dated Oct. 11, 2013, issued in corresponding U.S. Appl. No. 13/416,538.

* cited by examiner

SIGNATURE REPRESENTATION OF DATA HAVING HIGH DIMENSIONALITY

CROSS-REFERENCE TO RELATED APPLICATIONS

This application is a continuation of U.S. patent application Ser. No. 13/416,538, filed on Mar. 9, 2012.

TECHNICAL FIELD

The current application relates to systems, devices, and methods of generating signatures of data, and in particular to generating signatures of data having a high dimensionality.

BACKGROUND

The data produced by an information source may be viewed as a random realization produced from a certain probability distribution that is a unique characteristic of that particular source. Different sources will produce realizations of the data from distinct underlying probability distributions.

An information source is said to be producing sparse data if a typical realization of its data, when transformed by a fixed orthonormal transformation that is a characteristic property of that source, consists of only up to s non-zero values. The source is then said to be "s-sparse under that orthonormal transformation" or "s-sparse in the basis of that orthonormal transformation". As a special case, a source can be sparse under the identity orthonormal transformation which leaves the data unchanged, and in such a case the source is said to be "s-sparse its own domain".

For example, if the source produces vectors of dimensionality 10000, that is, vectors having 10000 elements, but a typical realization of the vector has only up to 10 elements with a non-zero value, then that source may be considered to be sparse, or more accurately 10-sparse, in its own domain. On the other hand if a typical realization of the vector, when transformed by the Fourier transform, has only up to 10 non-zero entries, then the source is said to 10-sparse in the Fourier or frequency domain. It is important to note that it is not generally known a-priori which elements of a realization, in its own domain or after a fixed transformation will be non-zero. It also may not always be known a-priori what the associated orthonormal transformation is. Typically, only the sparsity of the source, s, or at least an upper bound on it, is known with some certainty.

Although sparsity is, strictly speaking, a property of a random information source, it is an accepted terminology in the field to say that its data is sparse, where the data is implicitly presumed to be a random variable. It is not meaningful to talk of the sparsity of a single deterministic realization of data, since any deterministic realization is always sparse in its own basis.

A characteristic of sparse data is that it may be easily compressed. The compressed data may be used as a signature of the data for data analysis purposes, or may be subsequently de-compressed, effectively recreating the original sparse vector, prior to use.

A common example of compression is that of compressing an image. The image date may be compressed prior to transmission over a network and later decompressed for display without impacting, or having an acceptable impact on, the information to be conveyed, that is the image. The compressed image may be considered a signature of the image and may be used as a representation of the data. For example the compressed data of an image could be used as a fingerprint of the uncompressed image.

It is desirable to have a technique of generating a compressed representation of a high dimensionality sparse data that does not require huge memory allocation in order to calculate the compressed representation. Moreover, if the data is sparse in its own domain, it is desirable to exploit this property to reduce the number of computation need in computing the signature to O(s), as well.

BRIEF DESCRIPTION OF THE FIGURES

Further features and advantages of the present disclosure will become apparent from the following detailed description, taken in combination with the appended drawings, in which.

DETAILED DESCRIPTION

In accordance with the present disclosure there is provided a method for generating, in a computing device, an m-dimensional signature vector comprising m vector elements. The method comprises: accessing a plurality of key-value pairs, each comprising a respective key, corresponding to one of n unique identifiers, and a non-zero value; and calculating each vector element based on a summation of a plurality of terms, each term calculated from a respective key-value pair by: generating a seed based on the key of the respective key-value pair and an element identifier associated with the vector element being calculated; generating a pseudo-random number from the generated seed; and multiplying the pseudo-random number by the value of the respective key-value pair, wherein $m \ll n$.

In accordance with the present disclosure there is also provided a computing device for generating an m-dimensional signature vector comprising a memory containing instructions; and a processor for executing instructions, the instructions when executed by the processor configuring the device to provide functionality for accessing a plurality of key-value pairs, each comprising a respective key, corresponding to one of n unique identifiers, and a non-zero value; and calculating each vector element based on a summation of a plurality of terms, each term calculated from a respective key-value pair by: generating a seed based on the key of the respective key-value pair and an element identifier associated with the vector element being calculated; generating a pseudo-random number from the generated seed; and multiplying the pseudo-random number by the value of the respective key-value pair, wherein $m \ll n$.

In accordance with yet another aspect there is provided a computer readable memory containing instructions for generating an m-dimensional signature vector which when executed by a processor perform a method of accessing a plurality of key-value pairs, each comprising a respective key, corresponding to one of n unique identifiers, and a non-zero value; and calculating each vector element based on a summation of a plurality of terms, each term calculated from a respective key-value pair by: generating a seed based on the key of the respective key-value pair and an element identifier associated with the vector element being calculated; generating a pseudo-random number from the generated seed; and multiplying the pseudo-random number by the value of the respective key-value pair, wherein m<<n.

Figure 1:
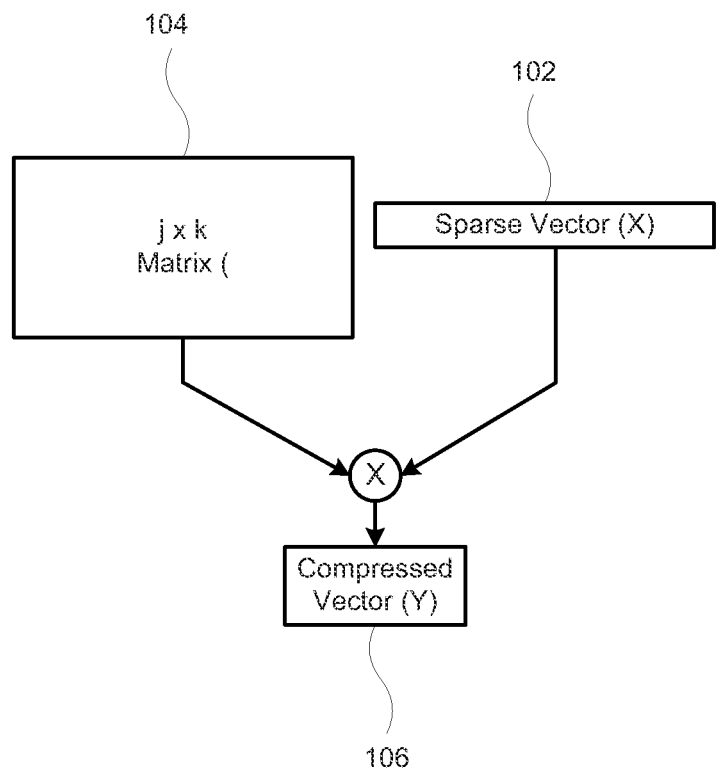
FIG. 1 depicts schematically a method of compressing sparse data, called compressive sensing.

FIG. 1 depicts schematically a recent method of compressing sparse data, called compressive sensing, or compressed sensing. In compressive sensing, a sparse data vector (X) 102 of dimensionality n is multiplied by a measurement matrix (D) 104 having dimensions m×n to generate a compressed vector Y 106 of dimensionality m, where m<<n. That is:

$$Y = \Phi X \qquad (1)$$

In order to generate the compressed signature Y, the measurement matrix $\Phi$ must be known in its entirety. The entries of $\Phi$ are drawn as independent identically distributed Gaussian random variables of zero mean and unit variance. In compressive sensing, the entries of D are statistically independent of each other and of the data being compressed, namely the sparse vector X. According to compressed sensing, the original vector X can be reconstructed from the compressed vector Y, with an acceptable error, by 'inverting', or undoing, the multiplication operation of $\Phi$, provided the number of compressive sensing measurements m are O(s), and the orthonormal transformation under which the data is sparse is known to the reconstructor. Specifically, there are reconstruction theorems that guarantee perfect reconstruction with high probability when m>=4s is satisfied.

Compressive sensing may work well in many applications. However, the requirement that the measurement matrix D be known a-priori and have dimensions dependent upon the dimensions of the sparse vector X makes the application of compressed sensing impractical, or even impossible for high-dimensionality sparse vectors. For example, the measurement matrix $\phi$ necessary to compute the compressed vector Y for a sparse vector X that has, for example, $2^{64}$ elements would require an unacceptably large amount of memory, in the order of $O(2^{64})$ to store the required measurement matrix $\Phi$. This memory allocation cannot be avoided even in case where the data is sparse in its own domain, because the location of the sparse entries is unknown a-priori. As such, current compressive sensing techniques are not well suited for generating a compressed vector from high dimensionality sparse vectors.

Compressed sensing can be used to generate a compressed vector from sparse data. However, in applications where the sparse data has high dimensionality, the size of the required measurement matrix used in generating the compressed vector can be prohibitively large. As described further herein, it is possible to generate a signature of high-dimensionality data without requiring the measurement matrix be known a priori. As such, it is possible to practically generate a signature for data having a high dimensionality. The process described herein may not be considered to be compressive sensing as generally applied, since a measurement matrix that is statistically independent from the data is not used in calculating the compressed vector. The generated compressed vector is intended to be used as a signature of the sparse data, and as such, the reconstruction of the original data from the compressed data is not of great concern. Although not considered compressive sensing, the technique is generally based on compressive sensing techniques and as such is referred to as a compressive sensing signature herein.

A compressive sensing signature may be generated from any data, whether it is sparse or not, that is representable by a set of key-value pairs. For example, the data used to generate the compressive sensing signature may be a vector of dimension k, in which case the set of key-value pairs comprise of the non-zero elements of the vector as values, associated with the indices of such values as the keys. Note that this representation is always possible irrespective of whether the data vector is sparse or not. If the vector happens to be s-sparse in its own domain with s, then the number of key-value pairs in the set will also be s. However if the vector is s-sparse under some other non-trivial orthonormal transformation, then the resulting set of key-value pairs can be larger than s.

As a second example, the data may be a file comprising of a plurality of tokens, such as words in a text document. Such data may be represented as a plurality of key-value pairs, where a key is a token and its value is the frequency of occurrence of that token in the data. This key value representation need not be unique if we also allow repeated keys in the computation of the compressive sensing signature. For example a token that appears three times can be represented by a single key-value pair, with key=token and value=3, or three key-value pairs with key=token and value=1. The latter representation, with repeated keys, is useful when it is desired to calculate signature of a file incrementally in a single pass without having to make a prior pass to calculate the token-frequency pairs.

Lastly, in many cases the data may be generated directly in the form of key-value pairs and no further modification is necessary. For example, the data may be the radio scene of all Wi-Fi points or cell towers visible to a hand held device, where each key-value pair may consist of MAC address or other unique identifier of a visible radio transmitter as the key, and the received signal strength as the value.

A compressive sensing signature comprises m elements. The number of elements, m, may be determined based on the dimensionality of the data, and the expected sparsity of the data. As an example, m=32 may provide an acceptable signature in numerous application, although other signature sizes are possible such as 64, 128, 256. Each of the m elements of the compressive sensing signature is equal to a summation of one or more terms. Each of the one or more terms in the summation of an element associated with a respective key-value pair of the key-value pairs for which the signature is being generated, and is equal to, or proportional to if a weighting factor is used, the value of the pair multiplied by a pseudo-random number. Each of the pseudo-random numbers used in calculating the terms of the summation is generated from a seed based on the key of the key-value pair and a unique value associated with the element of the signature being calculated, which may be the index of the signature element being calculated. As described further below, it is possible to generate the compressed sensing signature in various ways that may or may not require explicitly having a set of key-value pairs with non-repeating keys.

Figure 2:
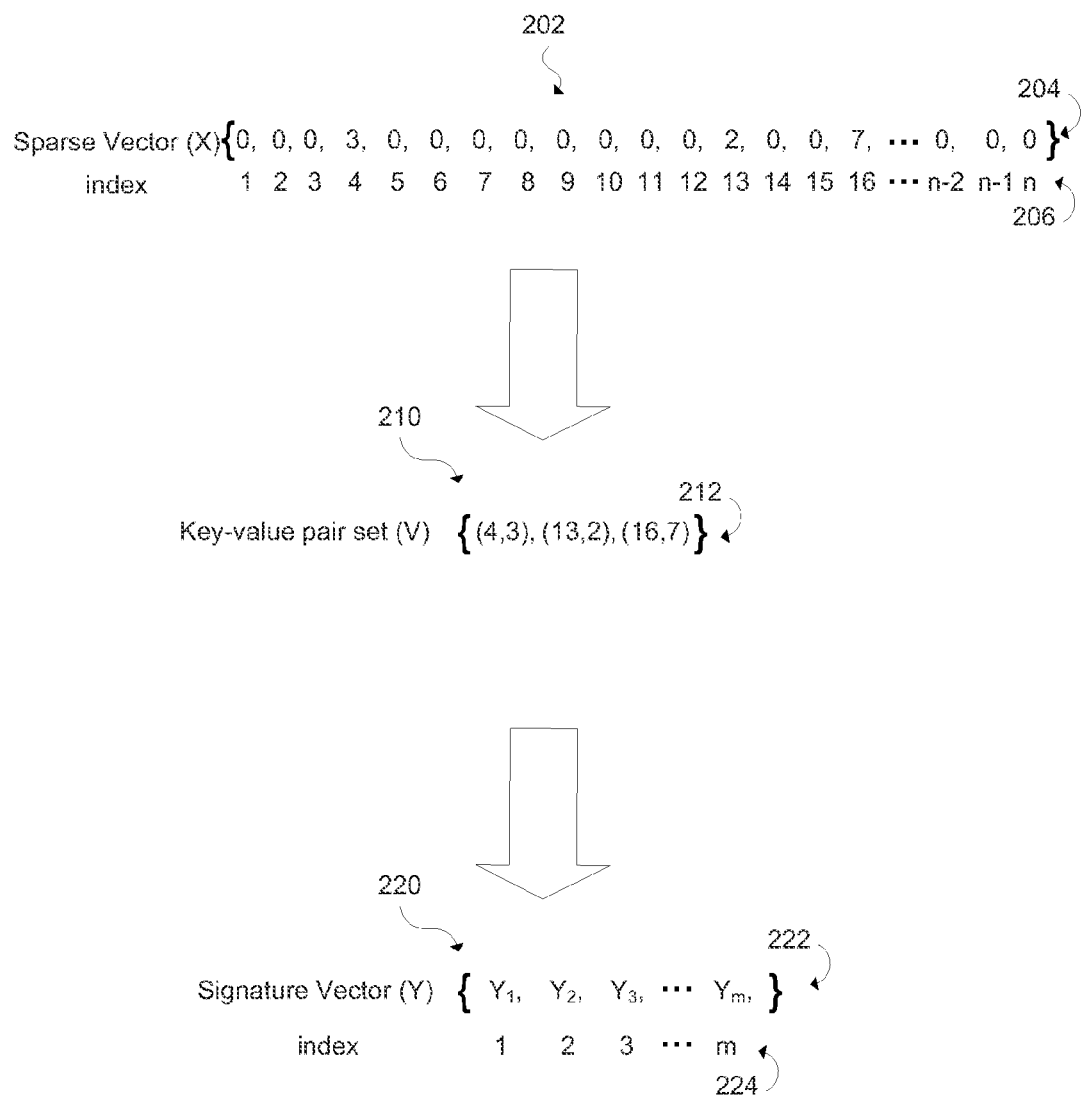
FIG. 2 depicts the various data elements in the compressive sensing signature technique.

FIG. 2 depicts the various data elements in the compressive sensing signature technique as applied to data presented in the form of a vector sparse in its own domain. Note, however, that the depicted method may remain applicable even to data that is a vector sparse under some non-trivial orthonormal transformation, or even to a vector that is not sparse at all.

As depicted, there are three types of variables, namely a sparse data vector (X) 202, a set of key-value pairs (V) 210, and the compressed signature vector (Y) 220. The sparse data vector X has n elements 204, each of which may be associated with a respective index 206. The sparse vector X may represent various types data, for example, X could be used to represent a text document. In such a case, each index 206 could be associated with a unique word, and the value of the element could represent the number of times the particular word appears in a text document. As will be appreciated, the number of unique words in a language is quite large, and as such the number of elements in the vector X, which would be equal to the number of words, is also large. However, the number of different words used in any particular document is typically only a small subset of the complete language and as such most of the elements will be zero-valued.

The set of key-value pairs V 210 comprises key-value pairs 212 from the sparse vector X, which have a non-zero element. That is, each key-value pair in V is associated with a unique word appearing in the text document. The key-value pairs 212 include the non-zero elements from the sparse vector X 202. The key of the key-value pair is the index of a non-zero element of X, or alternatively the key may be the unique word or other identifier associated with the index. The associated value of the key-value pair is the value of the associated element of X. In the text document example the value would be the frequency of occurrence of the unique word in the text document. As can be seen, the number of key-value pairs in the set V is equal to the sparsity of X, that is the number of non-zero elements of the vector X, which for sparse data will be much smaller than the dimension of X.

The above has assumed that the set of key-value pairs does not have repeating keys. However, as described further herein it is possible to generate a compressive sensing signature from a set of key-value pairs having repeating keys. For example a document comprising the string "example example example" may be represented by the non-repeating key-value pair set {("example", 3)}. Alternatively the document could be represented by the set of key-value pairs, having repeated keys, of {("example", 1), ("example", 1), ("example", 1)}. The same compressive sensing signature can be generated from the key-value pairs of either representation.

The signature vector Y 220 comprises a number (m) of elements, with m<<n. Each element 222 of the signature vector Y is associated with an index value 224. The value of each element 222 is calculated based on the key-value pair in the set V, as opposed to the sparse vector X, as described further below.

As should be clear, an actual sparse vector X does not need to be provided to determine the key-value pair set V. Using the text document example of above, a vector having zero values for all the words not in the document does not need to be constructed. Rather, the key-value pair set V can be constructed from the text document directly, for example by counting the occurrence of the different words, and associating the determined frequency of occurrence with each of the unique words present in the document. It is not necessary to associate a separate index value with a unique word; rather the byte-value of a word can itself be used as the index or key of the word. Thus it is not necessary to use a look up table to translate from a word to an integer index. All that is required is that the key of an entity or token like a word be some unique identifier of that entity or token. Further, since the compressive sensing signature may be generated using a set of key-value pairs having repeating keys; it may be possible to generate the compressive sensing signature directly without having to generate a set of key-value pairs having non-repeating keys. Thus the representation X and/or V can often be only conceptual, and actual calculation of the signature can be done from the data in its raw form, for example a document stored in memory. Returning to the example of the text document, the text document itself may be considered as the set of key-value pairs, with repeating keys, where the value associated with each key is assumed to be 1.

Continuing with the example of a text document, if the word "hello" having index 4 appears three times if could be represented as the key-value pair (4,3) or ("hello",3). It is also possible to represent it as three repeated key-value pairs: (4,1), (4,1), (4,1). The compressive sensing signature generated from either representation will be identical. The latter representation has the advantage that it is not necessary to make a prior pass on the document to calculate the frequencies of every word. Rather, as described further below, it is possible to directly and incrementally read the document and update all the m signature element values, so that as the document gets processed completely the signature vector Y is ready. This also means that when the document is partially processed, say only 90% of it, then the resulting signature is not "far" from the final answer in a mathematical sense, and can be put to good use. This property itself can be very useful in situations when only partial or incomplete data is available. Also, this property means that the signature may be computed in parts, and the parts subsequently combined together.

Each element of the signature vector Y can be directly calculated from the set of key-value pairs V, without requiring the large measurement matrix be known a priori. If the sparse vector X has s(X) non-zero elements, then the set of key-value pairs V provides a list of s(X) key-value pairs of the form (key K, value P). Since the sparsity of X may vary in different realizations of X, the number of key-value pairs in the set V is described as a function of X, namely s(X). Each element of the signature vector may be directly calculated as:

$$Y_i = \sum_{\ell=1}^{s(X)} R(f(i, K_\ell)) \cdot P_\ell \cdot G(K_\ell) \tag{2}$$

In (2) above, $K_l$ is the key of the l-th element's key-value pair in the set V and $p_l$ is the associated value of the l-th key-value pair in the set V. $R(f(i, K_l))$ is a value returned from a unit normal (N(0,1)) pseudo-random number generator using a seed of $f(i, K_l)$. It is noted that the pseudo-random number generator will generate the same value when given the same seed value. The function $f(\cdot)$ may be a hash function of the tuple $(i, K_l)$, such as:

$$f(i,K_l)=\text{hash}(\text{str}(i)+\text{str}(K_l)) \tag{3}$$

In (3) above str(•) and hash(•) may be common functions for generating a string from a variable, and generating a hash from a string respectively. Further the '+' operator may be the concatenation of strings.

The function $G(K_l)$ in (2) above provides an additional gain function, which may be used to provided flexibility, for example by providing flexibility in deprecating certain elements in the key-value pair set V.

From (2) above, it can be seen that each individual element of the signature vector Y is calculated as a summation of terms, with each term of the summation calculated from the value of a respective key-value pair multiplied by a pseudo-random number generated based on the key associated with the respective value and a unique value associated with the respective element of the signature vector being calculated. As depicted above in (2), the unique value associated with the respective element of the signature vector being calculated may be provided by the index of the element being calculated, however other values are possible.

From the above, it is clear that the calculation of the compressed sensing signature vector Y is done without requiring the generation of the measurement matrix Φ, whose size is proportional to the dimensionality of the sparse vector X, which may be extremely large. As such, the large storage requirements for calculating the compressed sensing signature vector are eliminated. Further, the calculation of the compressed sensing signature vector only involves non-zero data, and hence unnecessary multiplication, i.e. multiplication by zero, and calls to the random number generator are avoided, thereby reducing the computational complexity of generating the compressive sensing signature.

Strictly speaking equation (2) above is not an exact implementation of the compressive sensing of equation (1) since the normal variables provided by the pseudo-random number generator are not completely independent of the data as is the case of the measurement matrix Φ. However, given the benefits of the approach described by (2), any dependence of the normal variables on the data may be acceptable. Further the dependency is only via the seed, and hence results in only very low level long range correlations that may be virtually undetectable when using an adequate pseudo-random number generator.

Figure 3:
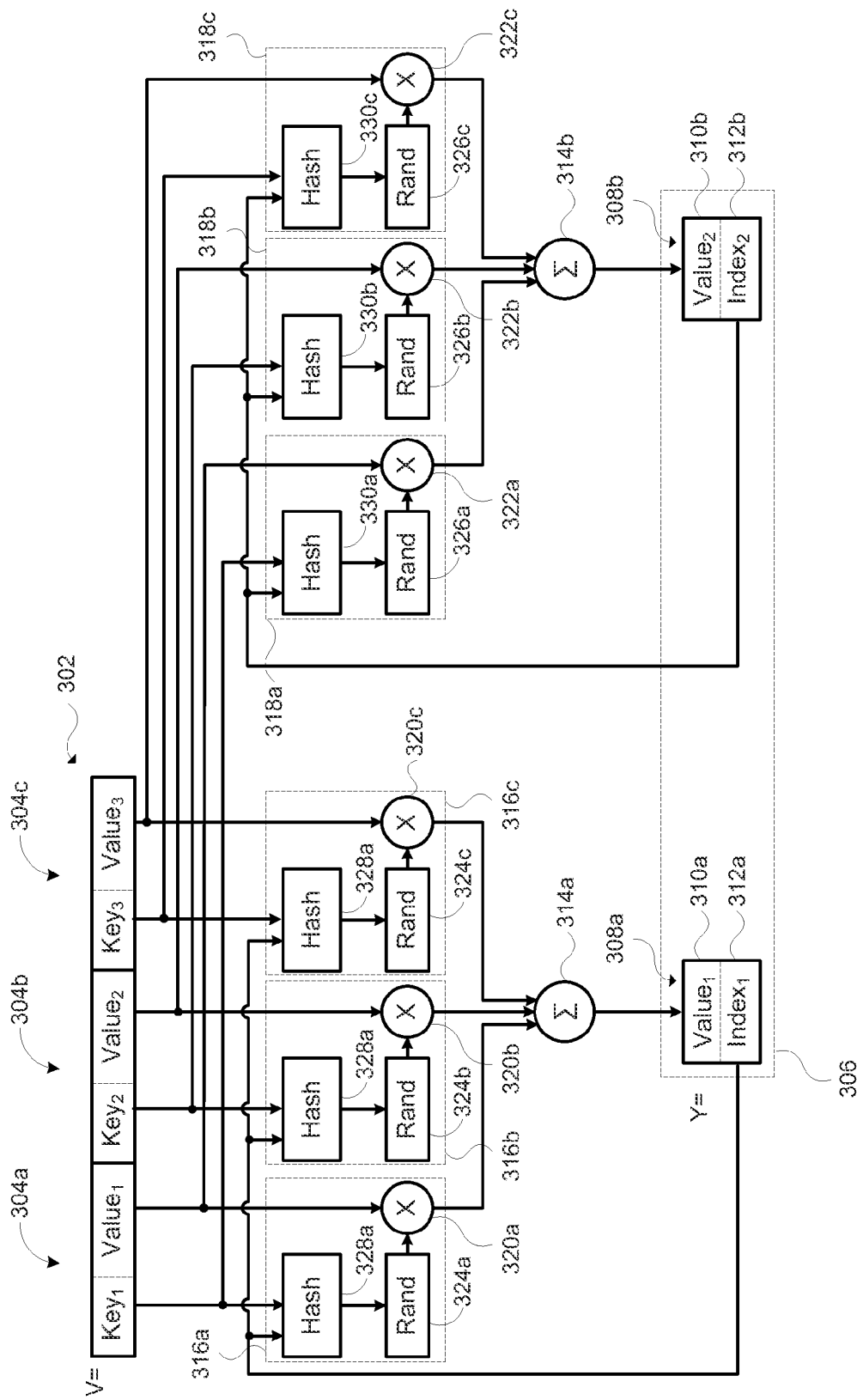
FIG. 3 depicts generating a compressed sensing signature vector.

FIG. 3 depicts generating a compressed sensing signature vector. FIG. 3 depicts calculating a compressed sensing signature vector having two elements. It is contemplated that the length of the signature may vary depending upon the application. Different applications may have different dimensions of the sparse vector, as well as different expected sparsities of the data and different probabilities of the possible data. Although different lengths of signatures are possible, a signature of 32 elements may be used as a default size, which is suitable for many applications. As described above, each element of the compressed sensing vector is calculated in the same manner, regardless of if the signature vector has two elements, 32 elements or more.

As depicted in FIG. 3, the key-value pair set V 302 has three elements 304a, 304b, 304c of respective key-value pairs. The compressed sensing signature vector Y 306 is depicted as having two elements 308a, 308b each having a value 310a, 310b and associated index value 312a, 312b.

As is clear from FIG. 3, each value 310a, 310b is calculated as a summation 314a, 314b, of a plurality of terms 316a, 316b, 316c and 318a, 318b, 318c respectively. The number of terms in each summation 314a, 314b is equal to the number of key-value pairs, including repeated keys, in the set V. Each term 316a, 316b, 316c, 318a, 318b, 318c used in the summation may be calculated as a multiplication 320a, 320b, 320c, 322a, 322b, 322c of a respective value of the respective key-value pair 304a, 304b, 304c of the set V and a random number 324a, 324b, 324c, 326a, 326b, 326c generated from a pseudo-random number generator. The pseudo-random number generator may generate each of the random numbers 324a, 324b, 324c, 326a, 326b, 326c using a respective seed value. Each of the seed values 328a, 328b, 328c, 330a, 330b, 330c may be generated from the key of the respective key-value pairs 304a, 304b, 304c of the set V and the respective index 312a, 312b, or unique identifier, of the element of the compressed sensing signature vector being calculated.

The process of FIG. 3 is intended to clarify the conceptual generation of the compressed sensing signature vector, and it should be appreciated that other processes for the generation are possible. For example, each term used in the summation is depicted as being calculated in parallel; however, it is contemplated that the terms could be calculated sequentially. Further, the multiplication of the random numbers by the respective values could be accomplished by adding the random numbers together a respective number of times based on the value.

Figure 4:
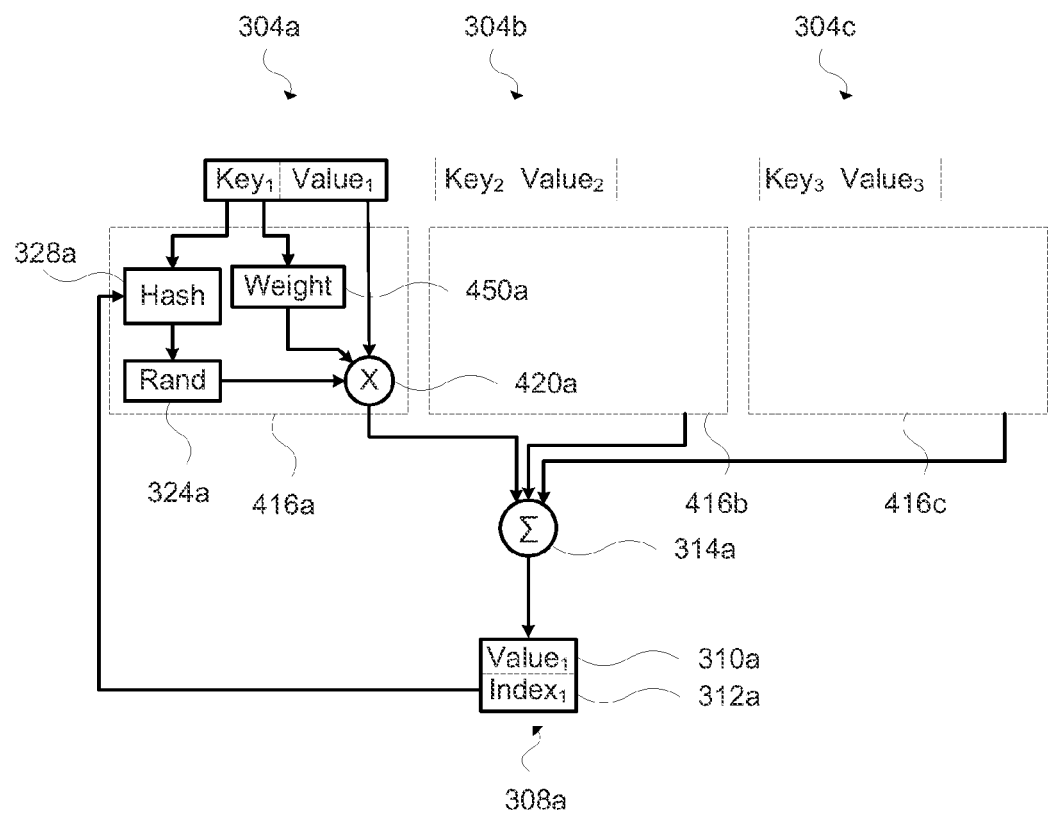
FIG. 4 depicts generating a compressed sensing signature vector.

FIG. 4 depicts generating a compressed sensing signature vector. The process depicted in FIG. 4 is substantially similar to that described above with regards to FIG. 3; however, the calculation of each of the terms 416a, 416b, 416c used in the summation 314a, includes a weighting term 450a (depicted for term 416a only). FIG. 4 only depicts the details for the calculation of a single term 416a used in the summation 314a for a single element 308a in the signature vector. The calculation of the other terms 416b, 416c may also include a similar weighting term.

As depicted in FIG. 4, the term 416a used in the summation 314a is equal to a multiplication 420a of the random number 324a, the value of the key-value pair 304a in the set V and a weighting term 450a. The weighting term 450a may be used to provide a means of providing more relevant terms. For example, if the set of key-value pairs is used to represent the occurrence of words in a document, the weighting term 450a may be a function that provides an indication of the importance of the word. The weighting term 450a may be provided by a weighting function that provides the weighting term based on the index or key of the key-value pair associated with the summation term being calculated.

Figure 5:
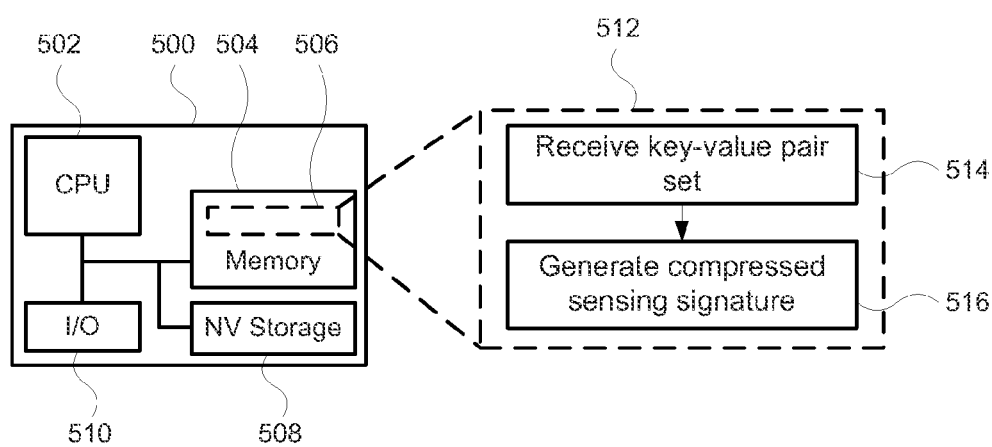
FIG. 5 depicts a device for generating a compressed sensing signature.

FIG. 5 depicts a device for generating a compressed sensing signature. The device 500 comprises a central processing unit (CPU) 502 for executing instructions and a memory 504 for storing instructions 506. The device may further comprise non-volatile (NV) storage 508 for providing permanent storage of instructions and data. The device 500 may further comprise an input/output (I/O) interface 510 for connecting one or more input or output devices to the CPU 502.

The instructions 506 stored in memory 504 may be executed by the CPU 502. When the instructions 506 are executed by the CPU 502, they configure the device 500 to provide functionality 512 for generating a compressed sensing signature. The functionality 512 includes functionality for accessing a set of key-value pairs 514, which may include repeated keys. The accessed key-value pair set comprises at least one key-value pair with each key-value pair comprising a key corresponding to one of n unique identifiers and an associated non-zero value of n-dimensional sparse data. The functionality 512 further includes functionality for generating the compressed sensing signature 516 from the set of key-value pairs. The functionality for generating the compressed sensing signature may be provided in various ways.

The signature processing and generation may be performed on an individual device having one or more processors or is scalable to a framework for running applications on large cluster of computing devices or distributed cluster of computing devices. The compressive sensing signature generation described can be divided into many small fragments of work, each of which may be executed or re-executed on any node in the cluster providing very high aggregate bandwidth across the cluster. Similarly the process of comparing or analyzing the generated compressive sensing signatures can be performed in a distributed system as well. One particular way of generating the compressed sensing signature from the received vector is described further with regards to FIG. 6.

Figure 6:
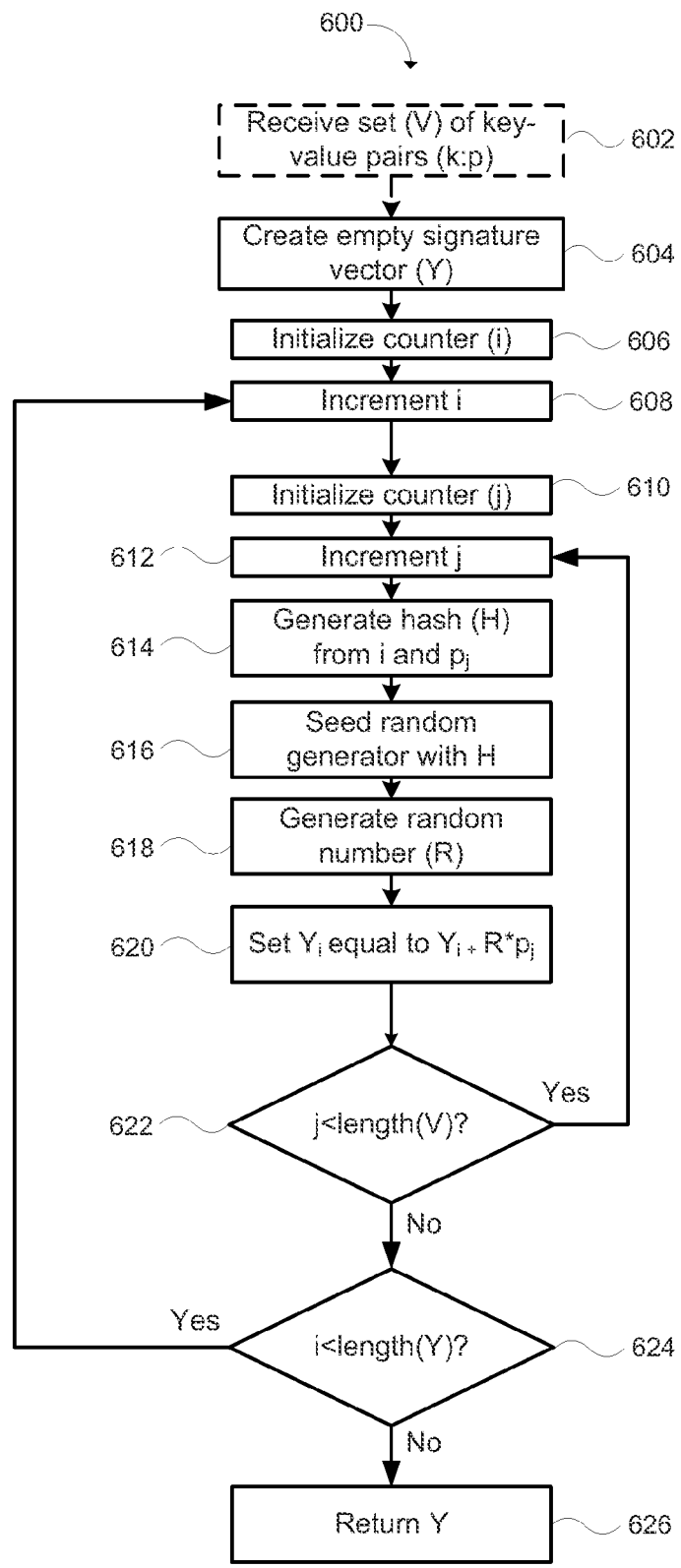
FIG. 6 depicts a method of generating a compressed sensing signature.

FIG. 6 depicts a method of generating a compressed sensing signature. The method 600 may be used to generate a compressed sensing signature from a set of key-value pairs V. The set V may comprise unique keys, or may have repeating keys. The set V comprises at least one key-value pair, wherein each key is a respective index or identifier of the sparse data and the associated value is a value of the sparse data associated with the respective index or identifier.

The set of key-value pairs V comprising one or more key-value pairs may be accessed (602), which may include retrieving the data for example from a storage device or receiving the key-value pairs from a portable electronic device. The set V has n elements, where n>=1. The method 600 creates an empty signature vector (Y) of m elements (604). The empty signature vector Y has m zero-valued elements. The method initializes a first counter (i) (606). The counter (i) is used to loop over each element in the signature vector Y and calculate the element's value. Once the counter is initialized, it is incremented (608). It is noted that in the method 600 the counter (i) is initialized to one less than the first index of the signature vector Y so that when it is incremented, the first element of the signature vector Y will be referenced. Further, it is noted that the initialization and incrementing of the counter (i) may be done implicitly, for example by using a 'for-next' loop, or other programmatic means. Once the first counter (i) is initialized/incremented, a second counter (j) is similarly initialized (610) and incremented (612). The second counter (j) is used to loop over each element in the set V to calculate the summation terms from the key-value pairs of the set V elements.

Once the second counter (j) is initialized/incremented a hash (H) is generated from the concatenation of the value of the first counter (i) and the key of the j-th key-value pair of the set V (614). Once the hash (H) is calculated, it is used as the seed for a random number generator (616), and a random number (R) is generated from the seeded random number generator (618). Once the random number (R) is generated, the i-th element of the signature vector V, which was initialized to zero, is set equal to $S_i+R*p_j$, where $p_j$ is the value of the j-th key-value pair of the set V (620). Once the terms have been summed, it is determined if the second counter (j) is less than the number of key-value pairs in the set V (622). If the counter (j) is less than the number of elements in the set V (Yes at 622), there are further elements in the set V to use in calculating the element in the signature vector Y and the method returns to increment the second counter (j) and proceeds to incorporate the next key-value pair from the set V in the calculation of $Y_i$. If the counter (j) is not less than the number of elements (No at 622), than there are no more key-value pairs in the set V to use in calculating $Y_i$ and the method determines if the first counter (i) is less than the number of elements in the signature vector Y (624). If the counter (i) is less than the number of elements in the signature vector Y (Yes at 624), then there are further elements of the signature vector Y to calculate and the method increments the first counter (i) (610) and calculates the value of the next element of the signature vector Y. If the first counter (i) is not less than the number of elements in the signature vector Y (No at 624), then all of the elements of the signature vector Y have been calculated and the signature vector Y is returned (626).

The method 600 described above may generate a compressed sensing signature vector from a set of key-value pairs representative of sparse data. In certain applications, it is possible to generate the compressed sensing signature vector without requiring that the set of key-value pairs be provided explicitly. For example, if a compressed sensing signature vector is generated for a text document, it is possible to generate the compressed sensing signature vector directly from the text document by treating the individual words in the document as key-value pairs having repeated keys, with each value being 1. The compressed sensing signature vector can be generated directly from the key-value pairs, with assumed values, in the text document, with the contribution of each word added to the signature vector elements as the text document is processed.

Figure 7:
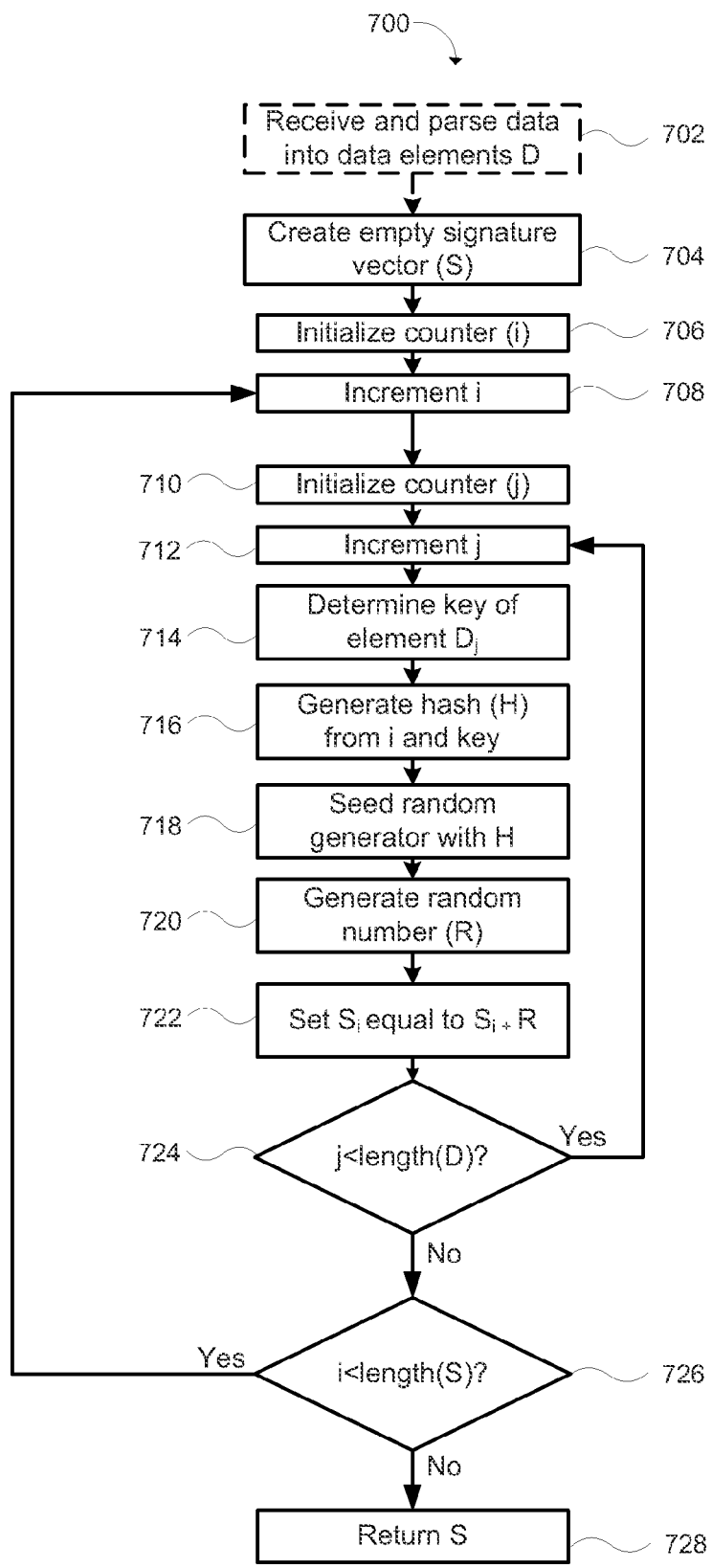
FIG. 7 depicts a further method of generating a compressed sensing signature.

FIG. 7 depicts a further method of generating a compressed sensing signature. The method 700 generates a compressed sensing signature vector Y from data that can be represented by a set of key-value pairs each comprising a unique identifier and an associated non-zero value of n-dimensional sparse data. The unique identifier is unique within the n-dimensions; however it may be repeated within the set V. The method 700 begins with accessing the data and parsing the data into a plurality of elements $D_{1 \ldots m}$ (702). For example, if the data comprises a text document, it may be parsed into the individual words. It is noted, that the data is described as being parsed completely for the clarity of the description. It is contemplated that as each token of the document is parsed may be processed. The parsed data may be considered as a set of key-value pairs with each value equal to 1. Next an empty signature vector Y is created (704). A first counter (i) is initialized (706) and incremented (708) to point to a first token in the data. A second counter (j) is then initialized (710) and incremented (712). The first counter (i) is used as an index to the element of the signature vector being calculated and the second counter (j) is used as an index into the received data, for example it may indicate the word being processed. Once the counters are initialized/incremented, a key associated with the parsed data element $D_j$ is determined (714). The key may be determined using a lookup table, or similar structure. Alternatively the key may be determined directly from the data element $D_j$. For example the key could be provided by the byte value of the word being processed. Once the key is determined, a hash (H) is generated from the first counter (i) and the determined key (716). The generated hash (H) is used as the seed to a random number generator (718) and a random number (R) generated (720). Once the random number (R) is generated, it is used in the calculation of the $Y_i$ element of the signature vector Y. The element $Y_i$ is set equal to the current value of $Y_i$ plus the random number R (722). Next, it is determined if the counter (j) is less than the number of parsed data elements in D (724). If it is (Yes at 724), then there are still more elements in the parsed data D to be processed, and the counter (j) is incremented (712) and the next element in the parsed data D processed. If the counter is not less than the number of parsed data elements D (No at 724), it is determined if the counter (i) is less than the number of elements in the signature vector Y (726) and if it is (Yes at 726), the counter (i) is incremented (708) and the next element of the signature Y calculated. If the counter (i) is not less than the number of elements in Y (No at 726) then all of the elements of the signature vector have been calculated, and the signature vector Y is returned (728).

The methods 600 and 700 described above describe different possible implementations for calculating the compressed sensing signature vector. As will be appreciated, the methods 600 and 700 are only two possible implementations for calculating the signature vector. Other methods for calculating the signature vector are possible. However, regardless of the specific implementation for calculating the signature vector, it is calculated without requiring a measurement matrix. Advantageously, without requiring a measurement matrix for calculating the signature vector, it is possible to calculate the signature vector for data from large dimension space using computing devices without requiring large amounts of memory.

Figure 8:
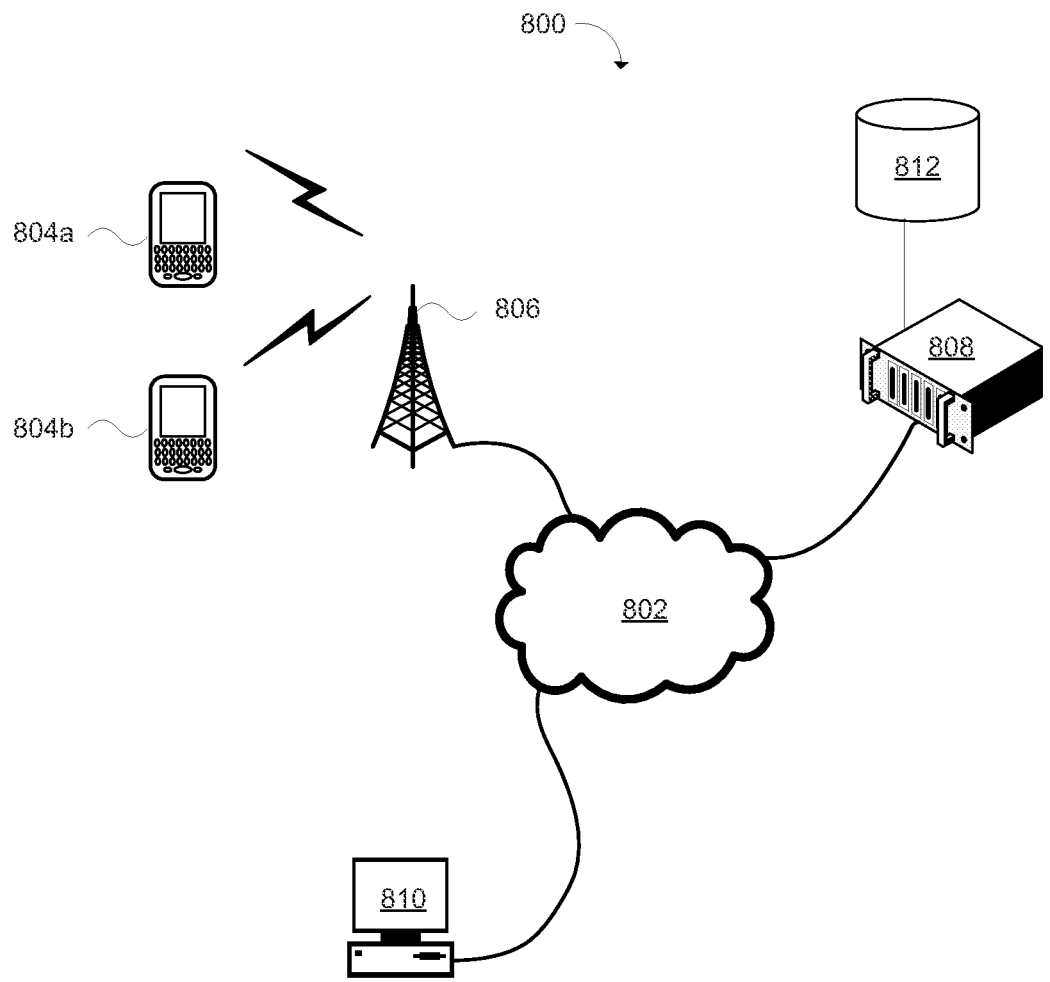
FIG. 8 depicts an environment in which generating a compressed sensing signature vector can be used.

FIG. 8 depicts an environment in which generating a compressed sensing signature vector can be used. The environment 800 comprises a network 802 connecting a plurality of devices together. The devices may include for example one or more mobile devices 804a, 804b, that are connected to the network 802 through a cellular infrastructure 806. The devices may further comprise one or more servers 808 connected to the network. The devices may further comprise one or more personal computers 810 connected to the network 802. It will be appreciated that the environment 800 is a simplified illustration of the possible devices, and other devices and/or components may be included in the environment. Due to the small memory footprint that is possible as a result of not using a large measurement matrix, it is possible to calculate a compressive sensing signature for high dimensional sparse data on any of the devices 804a, 804b, 808, 810. Generated compressive sensing signatures may be provided to a computing device for further processing or comparison and may be compared to other compressive sensing signatures either stored locally on a device or accessible through the network to a storage device 812, for example storage coupled to a server 808.

The compressive sensing signatures described above can be used to generate signatures of sparse data having very large dimensions. The compressive sensing signatures are universal, in that they do not depend on any structural properties, other than the sparsity, of the data, unlike other methods such as multi-dimensional scaling which need to do principal component analysis of the data. Further, the compressive sensing signatures described herein are simple to compute and do not require a large memory footprint to store a large measurement matrix as required by standard compressed sensing. As such, the calculation of the compressed sensing signatures is possible on many devices, including mobile devices such as smart phones, even for sparse data having large dimensionality.

The compressive sensing signatures described herein are also approximately homomorphic. That is, distances between data are preserved. That is, if the sparse data is considered a vector, then two vectors of sparse data that are close, will have compressed sensing signatures that are close. As such, the compressed sensing signatures may be used directly for comparison purposes, without having to reconstruct the original sparse data. For example, compressed sensing signatures of text documents may be used to compare the similarity of documents.

The compressed sensing signature vectors may be used in numerous different applications for generating a signature of sparse data. For example, compressed sensing signatures may be used to generate a signature representation of the wireless networks that are 'visible' at a particular location. A mobile device such as a smart phone may detect wireless devices in its vicinity, and use the information to determine its location. The mobile device may determine the Media Access Control (MAC) address as well as an associated indication of the received signal strength (RSSI) of the networks within its vicinity. As will be appreciated this information may be considered as sparse data, since a vector representing this information may be viewed as a vector that uses the MAC address as the index and the signal strength as the associated element value. The sparse data vector would then have $2^{64}$ elements, that is one element for each possible MAC address. Nearly all of these elements will be zero. Only the elements associated with the MAC addresses that the mobile device can detect will have a value. However, if standard compressive sensing was used to compress this data into for example a vector having 32 elements, a measurement matrix of dimension $2^{64} \times 32$ would be required. Such a memory requirement is impractical, if not impossible. However, as described above, a compressed sensing signature could be generated without requiring the measurement matrix, making its application possible in the mobile device. Further, since the sparse radio scene data observed at physically proximate location tends to have a lot of overlap, that is similar towers are visible with similar signal strengths, and since the compressed sensing signatures are homomorphic, the compressive sensing signatures of such sparse data will also be close together, allowing them to be used directly for purposes of comparing or determining physical location.

The above has referred to 64-bit MAC addresses as being used for generating the compressed sensing signature. It is noted that 48-bit MAC address are also commonly used. It is possible to generate a compressed sensing signature using both 64-bit and 48-bit addresses. One technique is to convert the 48-bit MAC address into a 64-bit MAC address. A 64-bit MAC address can be generated from a 48-bit MAC address by inserting two defined padding bytes, namely "FF" and "FE" in hexadecimal, between the first three bytes, which may form the organizationally unique identifier (OUI) and the last three bytes, which may provide an identifier that is uniquely assigned by the manufacturer. As such, a 48-bit MAC address of AC-DE-48-23-45-67 can be converted to the 64-bit MAC address AC:DE:48:FF:FE:23:45:67. The compressed sensing signature may generated from the 64-bit address, regardless of if it is a 64-bit MAC address or a padded 48-bit MAC address.

Another possible application of compressed sensing signatures is for generating a signature of a text document. The generated signature may be used for classification of the document, identification of the document, or other purposes such as subsequent searching for the document. In generating a compressed sensing signature of a text document, the sparse data may be considered as a vector with elements corresponding to all possible unique words. The unique words themselves may be used as a key or index, or alternatively, a dictionary may be used to index all of the possible words. The value of each element in the sparse data vector may be, for example the frequency of occurrence of the associated word in the document being classified. The data will likely be sparse since the text document will likely only have a small subset of the total number of possible words in the dictionary. As such most of the elements in the sparse data vector will be zero set of key-value pairs may be generated by parsing the words in the text document and counting the number of occurrences of each unique word in the text document. The set of key-value pairs may comprise a key-value pair for each of the unique words in the document, or alternatively may comprise a key-value pair for each word in the document. Regardless of if the set of key-value pairs comprises repeated keys, a compressed sensing signature may be generated from the set as described above. The compressed sensing signature may be used to categorize the text document, comparing the text document to other documents, searching for the text document, etc.

The above has described generating a compressed sensing signature as a vector of a known size m. It is possible to take the sign of the value of each element of signature to provide a binary signature. The resulting signature in $\{-1,+1\}^m$ is also an approximately homomorphic representation under the Hamming distance. Such a binary signature may be useful if the signature is to be used as an input to machine learning algorithms that expect discrete valued data. The binary valued signature may be considered as providing a robust universal quantization of real vectors.

One possible implementation of generating a compressed sensing signature for text documents is depicted below in code. The implementation generates the compressed sensing signature directly from the text document, that is, the received data of the text document is used as a set of key-value pairs, where the keys can be repeated and the values are assumed to be 1. The implementation also uses a weighting of words to allow certain terms to be weighted, for example based on an importance of the word. The implementation also looks at individual words, as well as pairs of consecutive words in generating the signature.

```
#The following provides a distance preserving (homomorphic)
#compressive sensing signature
#In particular, this is an efficient implementation that
#exploits the sparsity of input data.
#It avoids the explicit creation of wordbags, and also
avoids
#loading an entire measurement matrix in memory.
#So it is fast, online (incremental), and requires little
storage.
#The function looks not only at
#individual words, but also pairs of consecutive words.
#This gives a better representation of the text content
#under consideration.

defCreateSignature(Content,NumSignatureValues,Type):
    #Get rid of non-alphanumeric characters
    for a in '"\'.,:;?!_"*': Content = Content.replace(a,' ');
    tmp = Content.split ( ) ;
    Signature = numpy.zeros(NumSignatureValues);
    for k in range(0,NumSignatureValues-2,2):
        ctr = -1;
        for item in tmp[0:len(tmp)]:
            ctr = ctr + 1;
            stuff = item; #word bag
            random.seed(str(k)+stuff);
            Signature[k] = Signature[k] + \
                WordWeightage(stuff)*random.gauss (0,1.0);
            ifctr<len(tmp)-1:
                stuff = item + " " + tmp[ctr+1]; #pair-word bag
                random.seed(str(k+1)+stuff);
                Signature[k+1] = Signature[k+1] + \
                    WordWeightage(stuff)*random.gauss(0,1.0);
    if Type = = "binary":
        returnnumpy.sign(Signature);
    else:
        return Signature;
#Chooses word weightage (Gain function for words)
#Other elaborate weight functions are possible. Also can be
made #domain specific,
#i.e. while classifying medical journal articles some words
#matter more than others
#than when classifying CNN articles.
CommonWords =
["the","of","and","a","to","in","is","be","that",\
"was","he","for","it","with","as","his","I","on",\
"have","at","by","not","they","this","had","are",\
"but","from","or","she","an","which","you","one",\
"we","all","were","her","would","there","their",\
"will","when","who","him","been","has","more",\
"if","no","out","do","so","can","what",];
defWordWeightage(txt):
#provide a weight for the received txt, which may be a word
or
#group of words.
#the importance of the word is assumed to increase in
proportion #to the length of the word
    words = txt.split( );
    weight = 0.0;
    for word in words:
        iflen(word) <= 2 or word in CommonWords:
            weight = weight + 0.0;
        else:
            #weight increases monotonically with length
            weight = weight + float(len(word))**0.5
    weight = weight/len(words);
    return weight;
```

Figure 9:
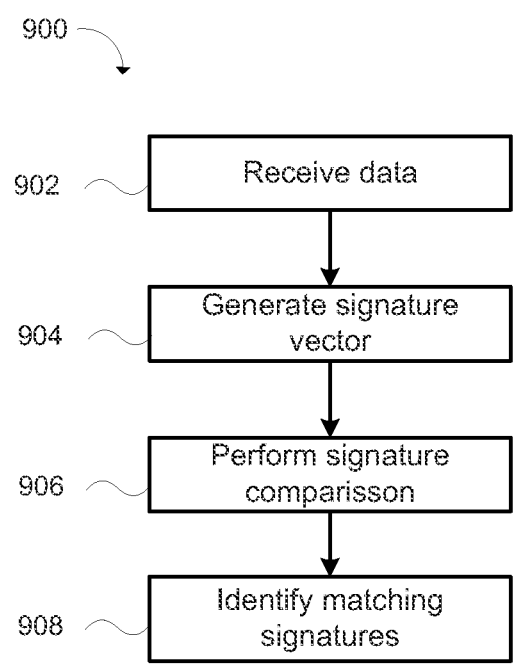
FIG. 9 depicts a method of comparing two signatures.

FIG. 9 depicts a method of comparing signatures. By comparing the closeness of signatures, various functionality may be provided, such as determining a location, matching input to a corpus, comparing handwritten signatures, classifying documents, etc. The method 900 commences with the reception of a signature vector, as described above, representable by a plurality of key-value pairs each comprising a unique identifier and an associated non-zero value of n-dimensional data. Elements of the m-dimensional signature vector are generated (902), each of the m elements equal to a summation of at least one term, each of the at least one term associated with a respective key-value pair of the plurality of key-value pairs and proportional to the non-zero value of the respective key-value pair multiplied by a respective pseudo-random number generated from a seed based on the unique identifier of the respective key-value pair and a unique identifier associated with the respective element of the signature vector being calculated. The signature may be generated on the device performing method 900 or on one or more remote devices coupled through a network. Once the compressive sensing signature vector is generated, a comparison between the generated signature and one or more other compressive sensing signatures is performed (904). Signatures that match, or a similar to, the generated signature can then be identified (906). The signatures used in the comparison may be received from another device, or they may be retrieved from previously stored signatures either stored locally on the device generating the signature vector or accessible through a network. For example, a search signature may be submitted, and used to retrieve documents associated with signatures that are determined to be close to the search signature.

The comparison between two signatures may be provided by the Euclidean distance between the two, which captures "difference" between the two signatures. Alternatively, the comparison may be made using the standard Inner Product, which captures the similarity between the two signatures. There usually are efficient math libraries for determining either the Euclidean distance or the inner product. However, it may be necessary to compare a candidate signature with a large number of pre-recorded signature vectors. Hence, it is desirable to use some computationally efficient way for finding the closest signature from a corpus of signatures, given some candidate signature. One illustrative way to do this is to first construct a vantage point tree (VP Tree) data structure from the corpus of signatures. Suppose the corpus had W signatures in it, where W can be a very large number, for example corresponding to hundreds of thousands of emails or documents, or millions of recorded radio scenes. The computational cost of construction of the VP Tree is O(W). Then when a candidate signature, for example from a document or radio scene is presented, the VP Tree can return the nearest K neighbors from the corpus of signatures, with a computational cost that is only O(K log N), which may be acceptable cheap since it is independent of W.

It is noted that the above described method of comparing two signatures is only one possible method of using the signatures. For example, a plurality of signatures may be formed into clusters to group similar information together. A search signature may then be used to determine the closest cluster and return the information associated with the determined cluster.

In some embodiments, any suitable computer readable media can be used for storing instructions for performing the processes described herein. For example, in some embodiments, computer readable media can be transitory or non-transitory. For example, non-transitory computer readable media can include media such as magnetic media (such as hard disks, floppy disks, etc.), optical media (such as compact discs, digital video discs, Blu-ray discs, etc.), semiconductor media (such as flash memory, electrically programmable read only memory (EPROM), electrically erasable programmable read only memory (EEPROM), etc.), any suitable media that is not fleeting or devoid of any semblance of permanence during transmission, and/or any suitable tangible media. As another example, transitory computer readable media can include signals on networks, in wires, conductors, optical fibers, circuits, any suitable media that is fleeting and devoid of any semblance of permanence during transmission, and/or any suitable intangible media.

Although the description discloses example methods, system and apparatus including, among other components, software executed on hardware, it should be noted that such methods and apparatus are merely illustrative and should not be considered as limiting. For example, it is contemplated that any or all of these hardware and software components could be embodied exclusively in hardware, exclusively in software, exclusively in firmware, or in any combination of hardware, software, and/or firmware. Accordingly, while the following describes example methods and apparatus, persons having ordinary skill in the art will readily appreciate that the examples provided are not the only way to implement such methods and apparatus.

What is claimed is:

1. A method for generating, in a computing device, an m-dimensional signature vector comprising m vector elements, the method comprising:
    setting an initial value of each vector element in the m vector elements to zero; and
    for each vector element in the m vector elements:
        accessing a plurality of key-value pairs sequentially, each key-value pair comprising a respective key, corresponding to one of n unique identifiers, and a non-zero value; and
        calculating each vector element based on a summation of a plurality of terms by repeating, sequentially, for each respective key-value pair in the plurality of key-value pairs:
            calculating a respective term of the plurality of terms based on the respective key-value pair from the plurality of key-value pairs by:
                generating a hash based on the key of the respective key-value pair and an element identifier associated with the vector element being calculated;
                generating a pseudo-random number from the generated hash; and
                multiplying the pseudo-random number by the value of the respective key-value pair; and
            adding the respective term calculated to the vector element being calculated,
    wherein $m \ll n$.

2. The method of claim 1, wherein no two key-value pairs have the same key.

3. The method of claim 1, wherein accessing the plurality of key-value pairs further comprises:
    receiving data; and
    determining the plurality of key-value pairs based on the received data.

4. The method of claim 3, wherein the data received is a complete set of data.

5. The method claim 3, wherein the data received is an incomplete set of data.

6. The method of claim 3, wherein the received data comprises text data and wherein determining the plurality of key-value pairs from the received text data comprises:
    parsing the text data into a plurality of tokens; and
    determining a frequency of occurrence of each unique token in the plurality of tokens parsed from the text data, wherein, for each key-value pair, its key corresponds to a unique token, and its non-zero value is the determined frequency of occurrence of the unique token.

7. The method of claim 1, wherein the plurality of key-value pairs includes at least two key-value pairs having the same key.

8. The method of claim 7, further comprising:
    receiving text data; and
    parsing the text data into a plurality of tokens,
    wherein the respective key of each key-value pair corresponds to a respective token of the plurality of parsed tokens, and the respective non-zero value of that key-value pair is 1.

9. The method of claim 1, wherein, for at least one term of the summation for at least one vector element, calculating that term further comprises multiplying the product of the respective pseudo-random number and the value of the respective key-value pair by a weighting value.

10. The method of claim of 1, wherein the element identifier associated with the vector element being calculated is based on an index value of the vector element being calculated.

11. The method of claim 10, wherein the hash is generated from concatenation of the element identifier associated with the vector element being calculated, and the key of the respective key-value pair.

12. The method of claim 11, wherein the hash is generated based on the function:

$$\text{hash}(\text{str}(i) + \text{str}(K_j))$$

wherein: i is the element identifier associated with the vector element being calculated, $K_j$ is the key of the respective key-value pair, and the '+' operator is a concatenation of strings.

13. The method of claim 1, wherein for each key-value pair, its key comprises a radio frequency (RF) transmitter address, and its value comprises a received signal strength indicator associated with the address.

14. A computing device for generating an m-dimensional signature vector comprising:
    a non-transitory computer-readable memory containing instructions; and
    a processor for executing instructions, the instructions when executed by the processor configuring the device to provide functionality for:
    setting an initial value of each vector element in the m vector elements to zero; and
    for each vector element in the m vector elements:
        accessing a plurality of key-value pairs sequentially, each key-value pair comprising a respective key, corresponding to one of n unique identifiers, and a non-zero value; and
        calculating each vector element based on a summation of a plurality of terms by repeating, sequentially, for each respective key-value pair in the plurality of key-value pairs:
            calculating a respective term of the plurality of terms based on the respective key-value pair from the plurality of key-value pairs by:
                generating a hash based on the key of the respective key-value pair and an element identifier associated with the vector element being calculated;
                generating a pseudo-random number from the generated hash; and
                multiplying the pseudo-random number by the value of the respective key-value pair; and adding the respective term calculated to the vector element being calculated, wherein m<<n.

15. The computing device of claim 14, wherein no two key-value pairs have the same key.

16. The computing device of claim 14, wherein the functionality for accessing the plurality of key-value pairs further comprises functionality for:
   receiving data; and
   determining the plurality of key-value pairs based on the received data.

17. The computing device of claim 16, wherein the data received is a complete set of data.

18. The computing device of claim 16, wherein the data received is an incomplete set of data.

19. The computing device of claim 16, wherein the received data comprises text data and wherein the functionality for determining the plurality of key-value pairs from the received text data comprises functionality for:
   parsing the text data into a plurality of tokens; and
   determining a frequency of occurrence of each unique token in the plurality of tokens parsed from the text data, wherein, for each key-value pair, its key corresponds to a unique token, and its non-zero value is the determined frequency of occurrence of the unique token.

20. The computing device of claim 14, wherein the plurality of key-value pairs includes at least two key-value pairs having the same key.

21. The computing device of claim 20, wherein the instructions executed by the processor further configure the device to provide functionality for:
   receiving text data and parsing the text data into a plurality of tokens,
   wherein the respective key of each key-value pair corresponds to a respective token of the plurality of parsed tokens, and the respective non-zero value of that key-value pair is 1.

22. The computing device of claim 14, wherein, for at least one term of the summation for at least one vector element, calculating that term further comprises multiplying the product of the respective pseudo-random number and the value of the respective key-value pair by a weighting value.

23. The computing device of claim of 14, wherein the element identifier associated with the vector element being calculated is based on an index value of the vector element being calculated.

24. The computing device of claim 23, wherein the hash is generated from concatenation of the element identifier associated with the vector element being calculated, and the key of the respective key-value pair.

25. The computing device of claim 24, wherein the hash is generated based on the function:

$$\text{hash}(\text{str}(i)+\text{str}(K_j))$$

wherein: i is the element identifier associated with the vector element being calculated, $K_j$ is the key of the respective key-value pair, and the '+' operator is a concatenation of strings.

26. The computing device of claim 14, wherein for each key-value pair, its key comprises a radio frequency (RF) transmitter address, and its value comprises a received signal strength indicator associated with the address.

27. A non-transitory computer readable memory containing instructions for generating an m-dimensional signature vector comprising m vector elements, the instructions which when executed by a processor perform the method of:
   setting an initial value of each vector element in the m vector elements to zero; and
   for each vector element in the m vector elements:
      accessing a plurality of key-value pairs sequentially, each key-value pair comprising a respective key, corresponding to one of n unique identifiers, and a non-zero value; and
      calculating each vector element based on a summation of a plurality of terms by repeating, sequentially, for each respective key-value pair in the plurality of key-value pairs:
         calculating a respective term of the plurality of terms based on the respective key-value pair from the plurality of key-value pairs by:
            generating a hash based on the key of the respective key-value pair and an element identifier associated with the vector element being calculated;
            generating a pseudo-random number from the generated hash; and
            multiplying the pseudo-random number by the value of the respective key-value pair; and
         adding the respective term calculated to the vector element being calculated,
   wherein m<<n.

* * * * *